United States Patent
Takahashi et al.

(10) Patent No.: US 12,057,743 B2
(45) Date of Patent: Aug. 6, 2024

(54) ABNORMALITY DETECTION SYSTEM OF ROTARY ELECTRICAL MACHINE

(71) Applicants: KABUSHIKI KAISHA TOSHIBA, Tokyo (JP); Toshiba Energy Systems & Solutions Corporation, Kawasaki (JP)

(72) Inventors: Norio Takahashi, Yokohama Kanagawa (JP); Masafumi Fujita, Yokohama Kanagawa (JP); Takahiro Sato, Yokohama Kanagawa (JP); Takashi Ueda, Yokohama Kanagawa (JP); Ken Nagakura, Ebina Kanagawa (JP); Masashi Kobayashi, Kawasaki Kanagawa (JP); Koji Ando, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 488 days.

(21) Appl. No.: 17/359,920

(22) Filed: Jun. 28, 2021

(65) Prior Publication Data
US 2022/0021277 A1 Jan. 20, 2022

(30) Foreign Application Priority Data
Jul. 16, 2020 (JP) .................. 2020-122085

(51) Int. Cl.
*H02K 11/20* (2016.01)
*G01R 33/00* (2006.01)
*G01R 33/02* (2006.01)

(52) U.S. Cl.
CPC ......... *H02K 11/20* (2016.01); *G01R 33/0005* (2013.01); *G01R 33/0017* (2013.01);
(Continued)

(58) Field of Classification Search
CPC ................ A61G 2203/74; A61G 7/015; A61G 7/05746; A61G 7/05769; A61G 7/05784;
(Continued)

(56) References Cited

U.S. PATENT DOCUMENTS
10,090,722 B2  10/2018  Yoshida et al.

FOREIGN PATENT DOCUMENTS
JP    S58-99243 A    6/1983
JP    3270105 B2    4/2002
(Continued)

OTHER PUBLICATIONS
JP-2019041441-A, , Tsujikawa et al., all pages. (Year: 2019).*
KR-20100040127-A, Lee Young Jun et al., all pages, (Year: 2010).*

*Primary Examiner* — Naishadh N Desai
(74) *Attorney, Agent, or Firm* — Foley & Lardner LLP

(57) ABSTRACT

In general, according to one embodiment, there is provided an abnormality detection system of a rotary electrical machine. The system includes a plurality of magnetic flux sensors disposed at intervals on a back of a stator core in a circumferential direction or an axial direction, and configured to detect a magnetic flux, and an abnormality detection apparatus configured to detect an abnormality of the stator core from a predetermined event that appears in a composite signal or a differential signal obtained from signals respectively output from at least two magnetic flux sensors of the plurality of magnetic flux sensors.

10 Claims, 10 Drawing Sheets

(52) U.S. Cl.
CPC ......... *G01R 33/0094* (2013.01); *G01R 33/02* (2013.01); *H02K 2213/03* (2013.01)

(58) Field of Classification Search
CPC .. H02K 3/12; H02K 3/28; H02K 1/16; H02K 3/14; H02K 3/18
See application file for complete search history.

(56) References Cited

FOREIGN PATENT DOCUMENTS

| | | | |
|---|---|---|---|
| JP | 3456824 | B2 | 10/2003 |
| JP | 2011-250626 | A | 12/2011 |
| JP | 2017-153344 | A | 8/2017 |
| JP | 6267933 | B2 | 1/2018 |
| JP | 2019-033658 | A | 2/2019 |
| JP | 2019041441 | A * | 3/2019 |
| KR | 20100040127 | A * | 1/2010 |

* cited by examiner

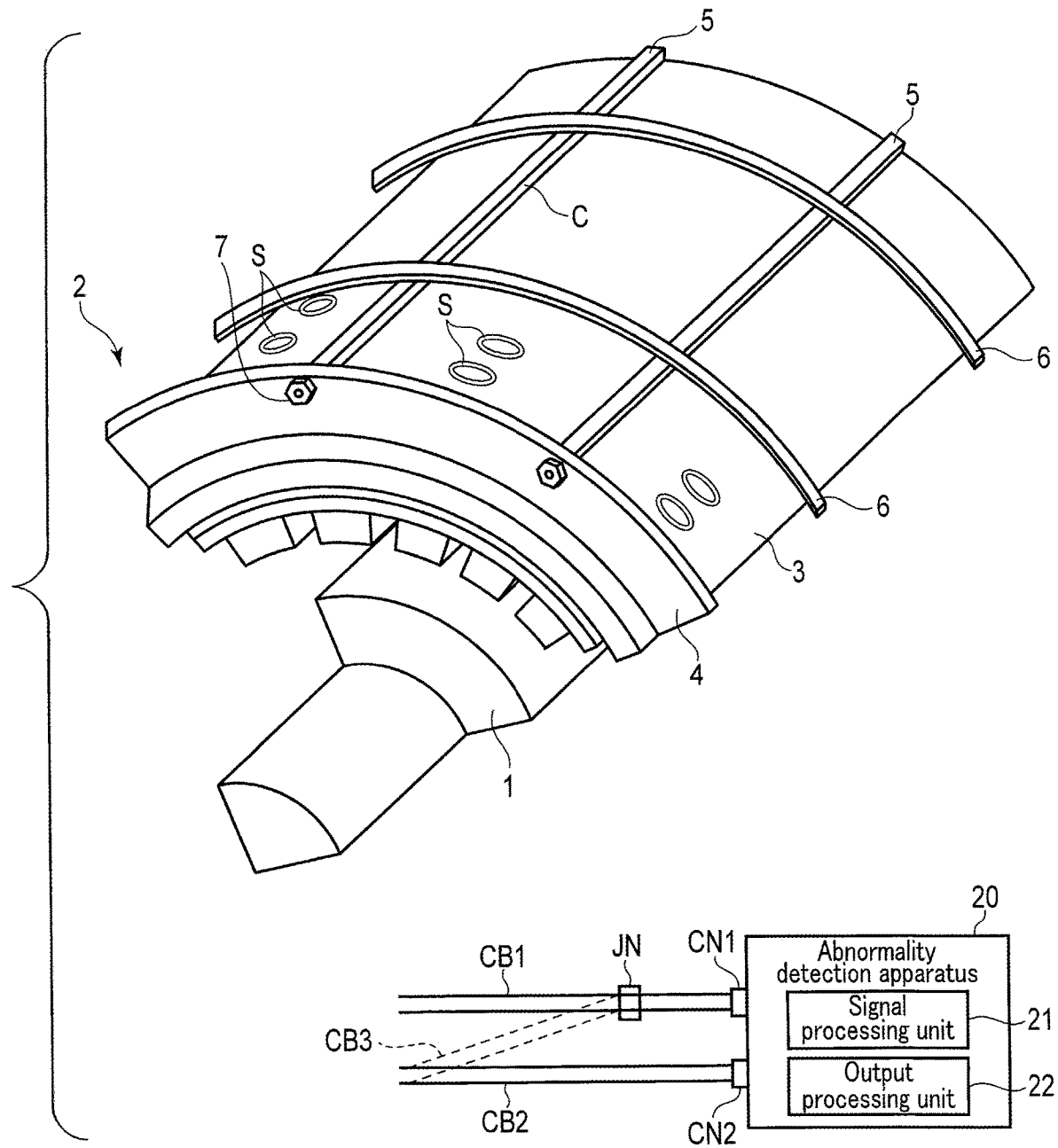
F I G. 1

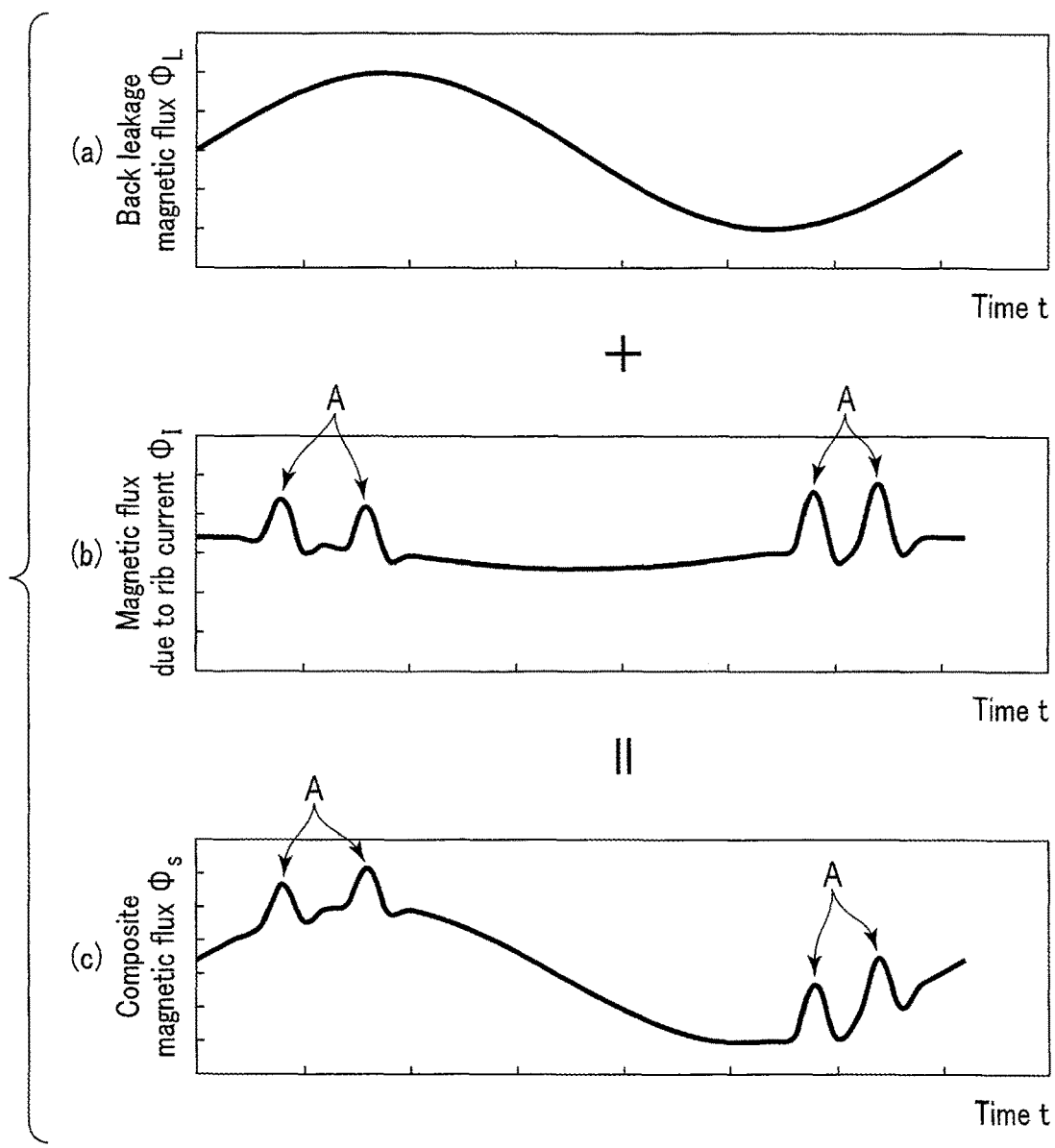
F I G. 4
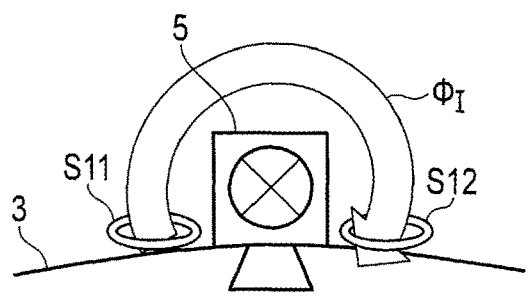
F I G. 5

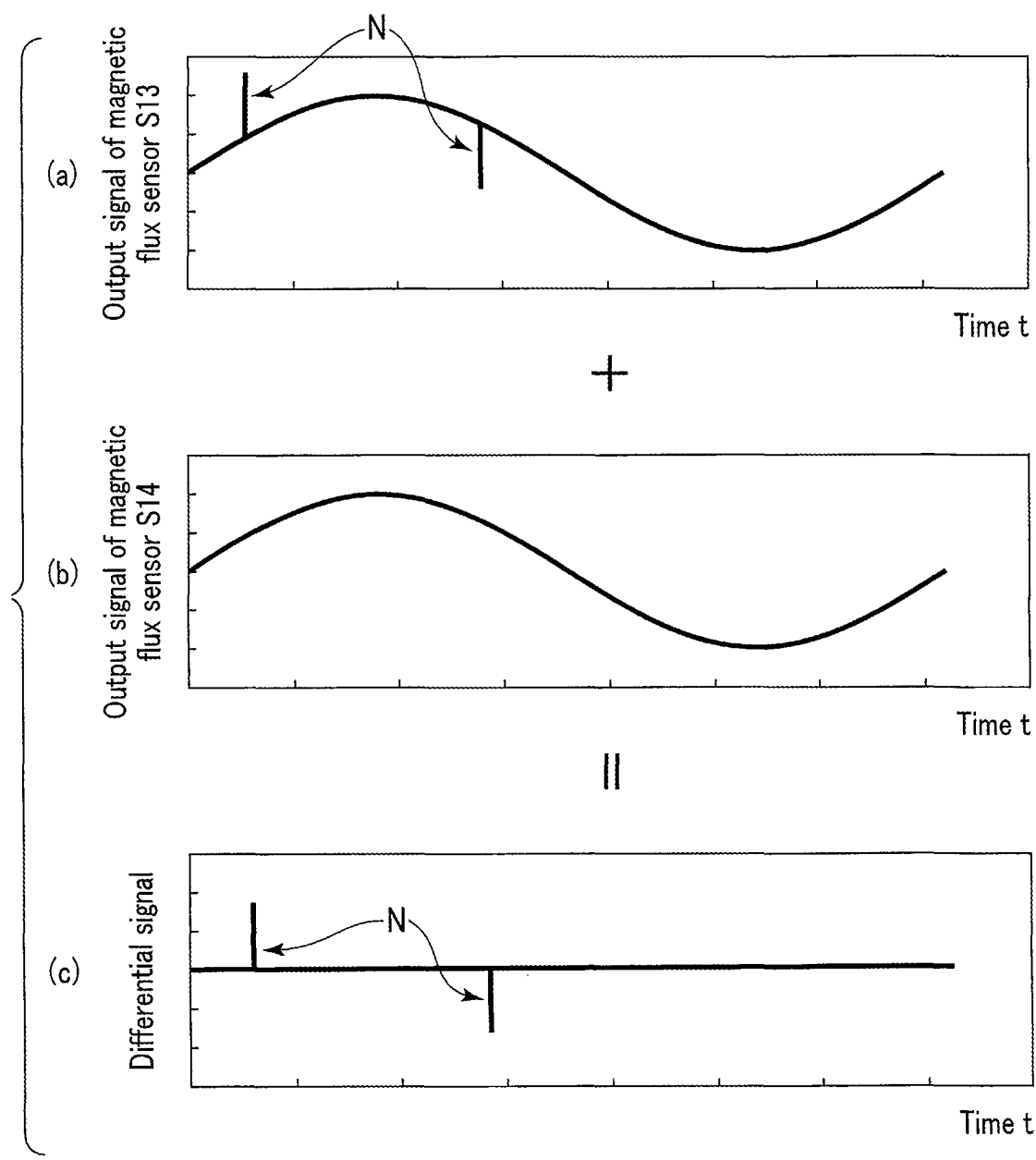
F I G. 8

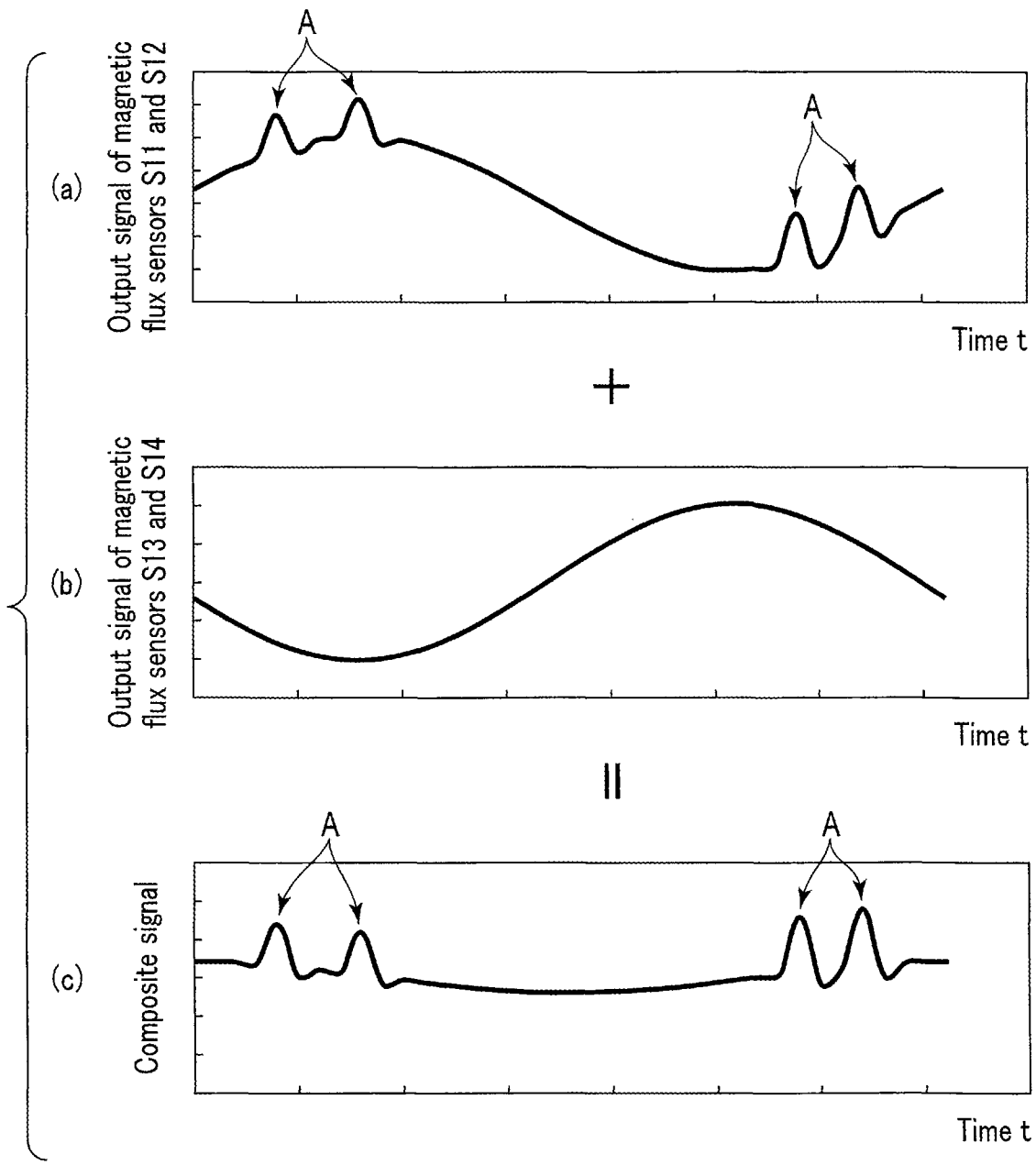
F I G. 10

ABNORMALITY DETECTION SYSTEM OF ROTARY ELECTRICAL MACHINE

CROSS-REFERENCE TO RELATED APPLICATIONS

This application is based upon and claims the benefit of priority from Japanese Patent Application No. 2020-122085, filed Jul. 16, 2020, the entire contents of which are incorporated herein by reference.

FIELD

Embodiments described herein relate generally to an abnormality detection system of a rotary electrical machine.

BACKGROUND

A rotary electrical machine, such as an electric generator or an electric motor drive, generally includes a rotor having a rotary shaft and a stator. The stator includes a cylindrical stator core formed so as to surround the rotor, and a stator frame covering the stator core with a cylindrical peripheral plate from a radial direction.

The magnetic attractive force that occurs with rotor rotation generates magnetic vibrations at the stator which must be prevented from propagating to a base on which the rotary electrical machine is mounted. In the stator of the rotary electrical machine in general, the stator core is supported by an elastic body, such as a spring plate or a spring rod, interposed between the stator core and the stator frame, thereby suppressing the magnetic vibrations propagating from the stator.

FIG. 12 shows an example of a support mechanism of the stator, in particular, the stator core on an outer peripheral side of the rotor in a conventional turbine electric generator.

A stator 2 located on the outer peripheral side of a rotor 1 includes a stator core 3, core presser plates 4, ribs 5, core presser rings 6, fastener members 7, a stator frame 8, partition plates 9, spring plates 10, core supporter plates 11, etc.

The stator frame 8 is formed of a cylindrical peripheral plate and annular partitioning plates 9 welded to an inner portion of the peripheral plate. The stator core 3 is formed of annular stacked cores fitted to the ribs 5 provided inside the core supporter plates 11, which are themselves annular.

The ribs 5 are inserted in dovetail-shaped key grooves provided in a peripheral portion of the stacked cores, which are held between the core presser plates 4 disposed at both axial ends and fastened by the fastener members 7 as one integral unit. In a large rotary electrical machine, the stator core 3's large shape renders it difficult to form an annular punched plate from a single piece. Therefore, an individual punched plate is formed of fan-shaped divisional plates sectioned at a small internal angle in a circumferential direction, and punched plates are stacked in the axial direction to form the stacked cores, in which the fan shapes of one punched plate are shifted by half of the internal angle from those of a neighboring punched plate.

Furthermore, the central axis of the stator core 3 is disposed to coincide with the central axis of the stator frame 8, and the partitioning plates 9 and the core supporter plates 11 are connected by the spring plates 10, which are plate-shaped members arranged in the circumferential direction. Since the partitioning plates 9 and the core supporter plates 11 are alternately arranged in the axial direction of the stator frame 8, the spring plates 10 are fixed to the partitioning plates 9 at both ends and the core supporter plates 11 are connected to central portions of the spring plates 10. Therefore, the stator core 3 is elastically supported by the stator frame 8 with the spring plates 10 bending in accordance with a displacement of the core supporter plates 11 in the radial direction.

In the rotary electrical machine having the above structure, a main magnetic flux generated from a field of the rotor 1 passes through the stator core 3. However, as shown in FIG. 13, part of the main magnetic flux leaks from the back (peripheral portion) of the stator core 3, causing a back leakage magnetic flux $\Phi_L$, which interlinks an electric circuit constituted by a support structure (the ribs 5, the core presser rings 6, etc.) of the stator core 3. Since the support structure of the stator core 3 requires mechanical strength, a support structure made of metal is used. Therefore, a current C, such as an eddy current, flows through the support structure of the stator core 3 due to the back leakage magnetic flux $\Phi_L$.

Furthermore, as shown in FIG. 14, the stator core 3 of the rotary electrical machine is formed of a stack of punched plates 12 coated with an insulating film through the baking of varnish on their surfaces. The stator core 3 includes cooling ventilation ducts (not shown) at regular intervals in the axial direction, and also stator slots 13 in which a stator coil (not shown) is housed. Dovetail-shaped key grooves 14 are formed in a radial outer portion of the punched plates 12. When the key grooves 14 are fitted with the ribs 5, the stator core 3 is fixed.

Although the surfaces of the punched plates 12 are coated with the insulating film, the insulating film is removed from the key grooves 14 of the punched plates 12, either when the ribs 5 are fitted into the grooves or due to core fastening work during the stacking process. Therefore, the radial outer side of each punched plate 12 is short-circuited by the rib 5. This is a short circuit of the punched plate 12, unavoidable when the stator core 3 is assembled, and referred to as a "first short circuit SC1".

To generate a voltage at a stator coil (not shown), in the stator core 3, a magnetic flux $\Phi$ flows in the circumferential direction, as shown in FIG. 14. As a result, a voltage is induced between the punched plates 12. However, no short-circuit current circulating the punched plates 12 flows except for the first short circuit SC1 in the radial outer side of the core in the stator, unless the punched plate 12 is short-circuited. This is a normal state of the stator core 3. If a second short circuit SC2 is formed for some reason, for example, when an inner peripheral surface of the core is damaged, a short circuit SC is formed to cause a circulation current to flow across the punched plates 12.

The circulation current flowing through the short circuit SC may generate Joule heat through a contact resistance at a position where the second short circuit SC2 is formed, or through arc heat due to a discharge. Such heat may further increase the damage of the stator core 3, cause an erosion of the stator core 3 or stator coil insulation damage (not shown), and lead to a major accident.

Conventionally, as a technique for monitoring a short circuit across punched plates of the stator core, an alert apparatus is known, in which magnetic flux detection coils are arranged to enclose a plurality of core blocks divided by ventilation ducts, a voltage induced in each magnetic flux detection coil is detected, and when the detected voltage exceeds a set value, an alert is output. Also, a monitoring apparatus is known which detects a change in magnetic flux due to an arc generated when a short circuit occurs in the core by monitoring a current flowing through a rib.

The conventional alert apparatus or monitoring apparatus can monitor an abnormality in the coil; however, arranging the magnetic flux detection coils to enclose the coil blocks involves extensive work and considerable cost. In addition, although an abnormality in each core block can be detected, for example, its circumferential position and details of the portion are difficult to determine.

Furthermore, a Rogowski coil or the like is used to measure a rib current. However, since this type of coil has a complicated shape and large size, problems of space limit the positions in which the coil can be placed. In addition, since the coil is expensive, it is difficult to set a plurality of coils.

Due to the above problems, there is a demand for a technique that can easily detect a stator core abnormality of the rotary electrical machine under operation with a simple configuration.

BRIEF DESCRIPTION OF THE DRAWINGS

FIG. 1 is a diagram showing an abnormality detection system according to an embodiment and a principal part of a rotary electrical machine;

FIG. 4 is a diagram showing an example of respective signal waveforms of a back leakage magnetic flux $\Phi_L$, a magnetic flux $\Phi_I$ due to a rib current, and a composite magnetic flux $\Phi_S$ thereof, when an arc (primary arc) is generated;

FIG. 5 is a diagram showing an example of an arrangement in which magnetic flux sensors S11 and S12 are disposed on both sides of a rib 5 so as to sandwich the rib 5;

FIG. 8 is a diagram showing an example of respective signal waveforms of an output signal of the magnetic flux sensor S13, an output signal of the magnetic flux sensor S14, and a differential signal corresponding to a difference between these output signals in the arrangement shown in FIG. 7;

FIG. 10 is a diagram showing an example of respective signal waveforms of an output signal of the magnetic flux sensors S11 and S12, an output signal of the magnetic flux sensors S13 and S14, and a composite signal thereof in the arrangement shown in FIG. 9;

DETAILED DESCRIPTION

Embodiments will now be described with reference to the accompanying drawings.

In general, according to one embodiment, there is provided an abnormality detection system of a rotary electrical machine. The system includes a plurality of magnetic flux sensors disposed at intervals on a back of a stator core in a circumferential direction or an axial direction, and configured to detect a magnetic flux, and an abnormality detection apparatus configured to detect an abnormality of the stator core from a predetermined event that appears in a composite signal or a differential signal obtained from signals respectively output from at least two magnetic flux sensors of the plurality of magnetic flux sensors.

Figure 12:
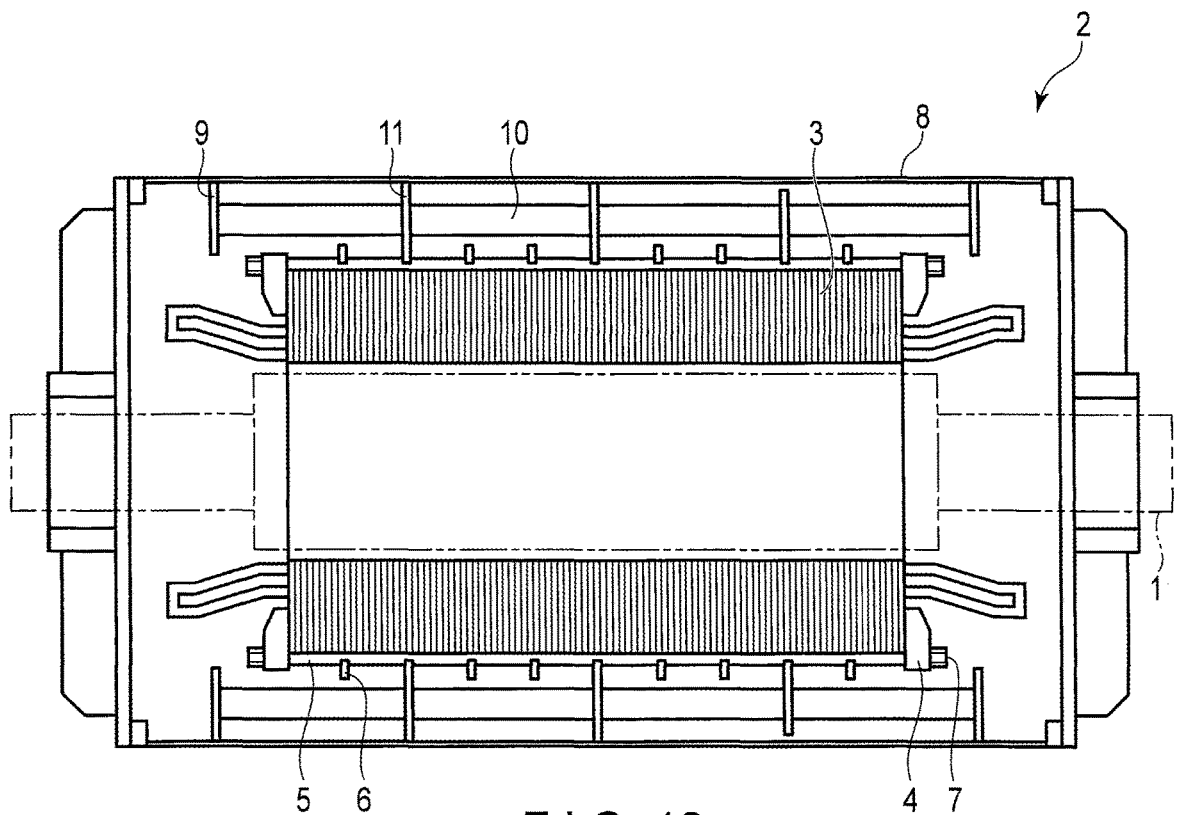
FIG. 12 is a diagram showing an example of a support mechanism of a stator, in particular, a stator core on an outer peripheral side of a rotor in a conventional turbine electric generator.
Figure 13:
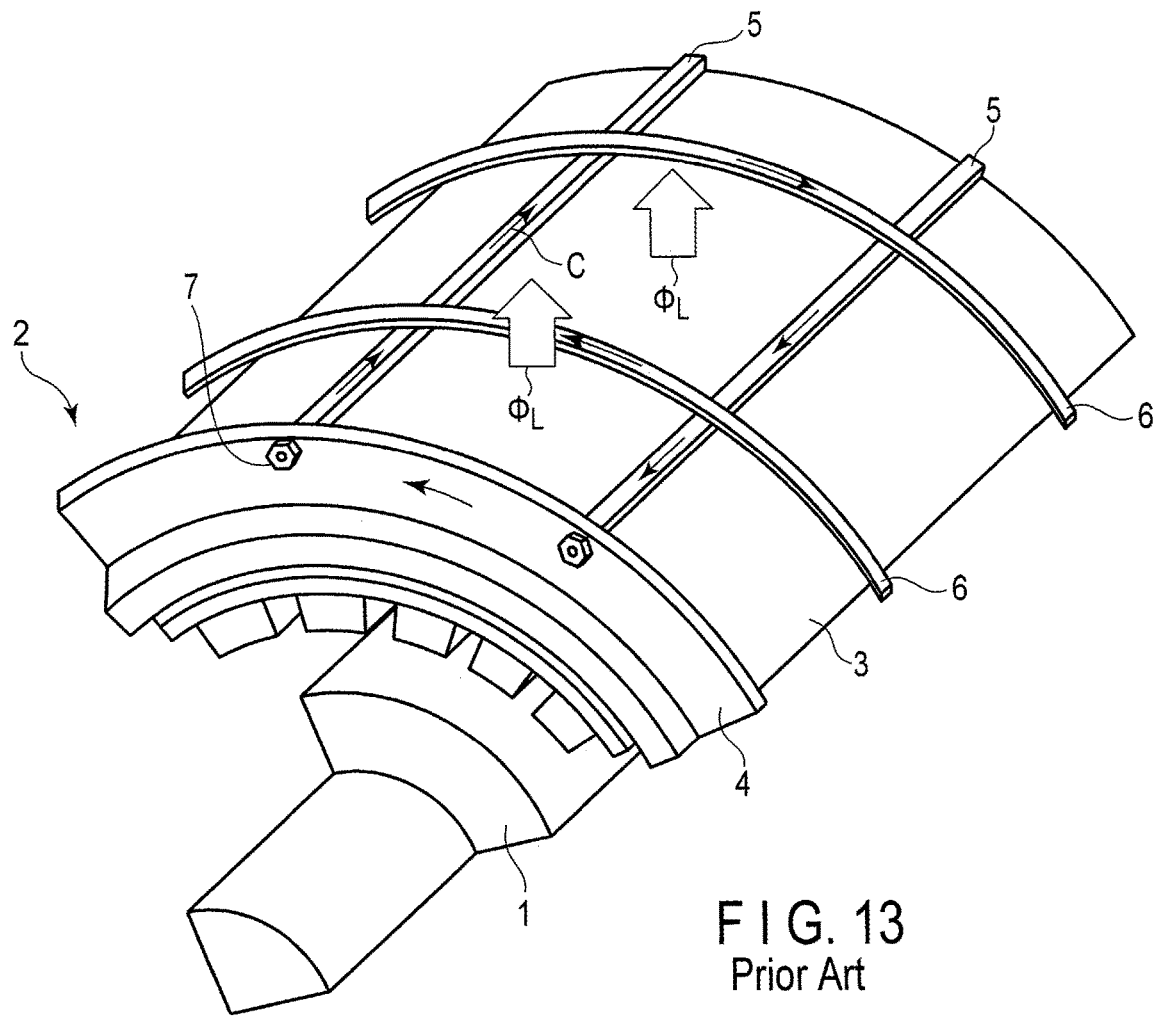
FIG. 13 is a diagram for explaining generation of a back leakage magnetic flux $\Phi_L$ and a current C.

In the following description, FIGS. 12 to 14 used for the above description will also be referred to if necessary.

<Entire Configuration>

FIG. 1 is a diagram showing an abnormality detection system according to an embodiment and a principal part of a rotary electrical machine. In FIG. 1, the elements that are the same as those shown in FIGS. 12 to 14 are denoted by the same symbols as those in FIGS. 12 to 14. The basic configuration of the rotary electrical machine is the same as that described above with reference to FIGS. 12 to 14.

As shown in FIG. 1, a rotary electrical machine (electric generator), to which an abnormality detection system of the embodiment is applied, includes a stator 2 located on the outer peripheral side of a rotor 1, the stator 2 including a stator core 3, core presser plates 4, a plurality of axial ribs 5, core presser rings 6, fastener members 7, etc.

The stator core 3 is formed of a plurality of annular stacked cores which form a cylindrical shape. Dovetail-shaped key grooves (key grooves 14 described above with reference to FIG. 14) are formed in peripheral portions of the respective stacked cores. The key grooves 14 are arranged at intervals in the circumferential direction. Each of the ribs 5 is fitted in the corresponding key groove to hold the stacked cores. The ribs 5 are held between the core presser plates 4 disposed at both axial ends and fastened by the fastener members 7 as a single integral unit. Each of the core presser rings 6 has a ring shape and presses the ribs 5 holding the stacked cores from a radial outer side.

<Configuration of Abnormality Detection System>

The abnormality detection system of the embodiment includes a plurality of magnetic flux sensors S configured to detect a magnetic flux generated on the back of the stator core 3, and an abnormality detection apparatus 20 configured to detect an abnormality of the stator core 3 based on a detection result of the magnetic flux sensors S.

The magnetic flux sensors S, each formed of a search coil or the like, are arranged at intervals in either the circumferential direction or the axial direction on the back of the stator core 3. The abnormality detection apparatus 20 detects an abnormality of the stator core 3 based on a predetermined event that occurs in a composite signal or a differential signal among the signals respectively output from at least two of the magnetic flux sensors S.

The output signals from the respective magnetic flux sensors S are transferred to the abnormality detection apparatus 20 through signal lines (cables). The cables respectively leading from the at least two magnetic flux sensors S may be coupled to connectors CN1 and CN2, for example, as are cables CB1 and CB2 shown in FIG. 1, so that the signals can be separately input to the abnormality detection apparatus 20. Alternatively, as with cables CB1 and CB3 shown in FIG. 1, the output signals of the respective magnetic flux sensors S may be either combined or subtracted at a junction JN, so that a composite signal or a differential signal can be input to the abnormality detection apparatus 20 through a single cable.

The cables CB1 and CB2 (or CB3) coupled to the abnormality detection apparatus 20 may be prepared for each of the at least two magnetic flux sensors S. However, to avoid complexity of the cable coupling, only one set of cables CB1 and CB2 (or CB3) may be coupled to the abnormality detection apparatus 20. In this case, a switch for selectively changing an input and an output may be prepared, so that a number of cables from the magnetic flux sensors S can be coupled to the one set of cables of the abnormality detection apparatus 20 via the switch.

The abnormality detection apparatus 20 includes a signal processing unit 21 and an output processing unit 22. The signal processing unit 21 performs various processes, such as the combination and subtraction of input signals, noise removal, phase correction, threshold determination, event detection, etc. The output processing unit 22 displays various information including signal waveforms or raises an alert, etc.

The at least two magnetic flux sensors S are provided for each of the ribs that holds the stacked cores on the back of the stator core 3. In the example of FIG. 1, the at least two magnetic flux sensors S are provided for one rib and disposed, along the longitudinal direction of the rib 5, on both sides of the rib so as to sandwich the rib in the circumferential direction of the stator core 3. The at least two magnetic flux sensors S may be disposed in positions within the rotary electrical machine that are magnetically symmetrical to each other. Details of the magnetic flux sensors will be described later.

The magnetic flux sensors S are preferably disposed within a fixed distance from the side surfaces of the rib 5. In this location, the magnetic flux that is generated due to a current flowing through the rib 5 can be detected more reliably. The magnetic flux sensors S are preferably disposed in end portions in the axial direction of the stator core 3 as shown in FIG. 1. Details of the locations will also be described later.

The signal processing unit 21 in the abnormality detection apparatus 20 has a function of correcting a phase shift that may occur depending on the positional relationship between the location of each magnetic flux sensor S and the location of a magnetic pole of the rotary electrical machine with respect to the signal output from each of the at least two magnetic flux sensors S, and outputting a composite signal or a differential signal of the corrected signals. The signal processing unit 21 has a function of raising an alert when either the value of the composite signal or the value of the differential signal exceeds a set value (threshold value), or a function of counting the number of times when either the value of the composite signal or the value of the differential signal exceeds a set value (threshold value), and displaying information indicative of the total number of counts or information indicative of the number of counts within a fixed period.

<Detection of Composite Magnetic Flux $\Phi_S$ of Back Leakage Magnetic Flux $\Phi_L$ and Magnetic Flux $\Phi_I$ due to Rib Current>

Figure 2:
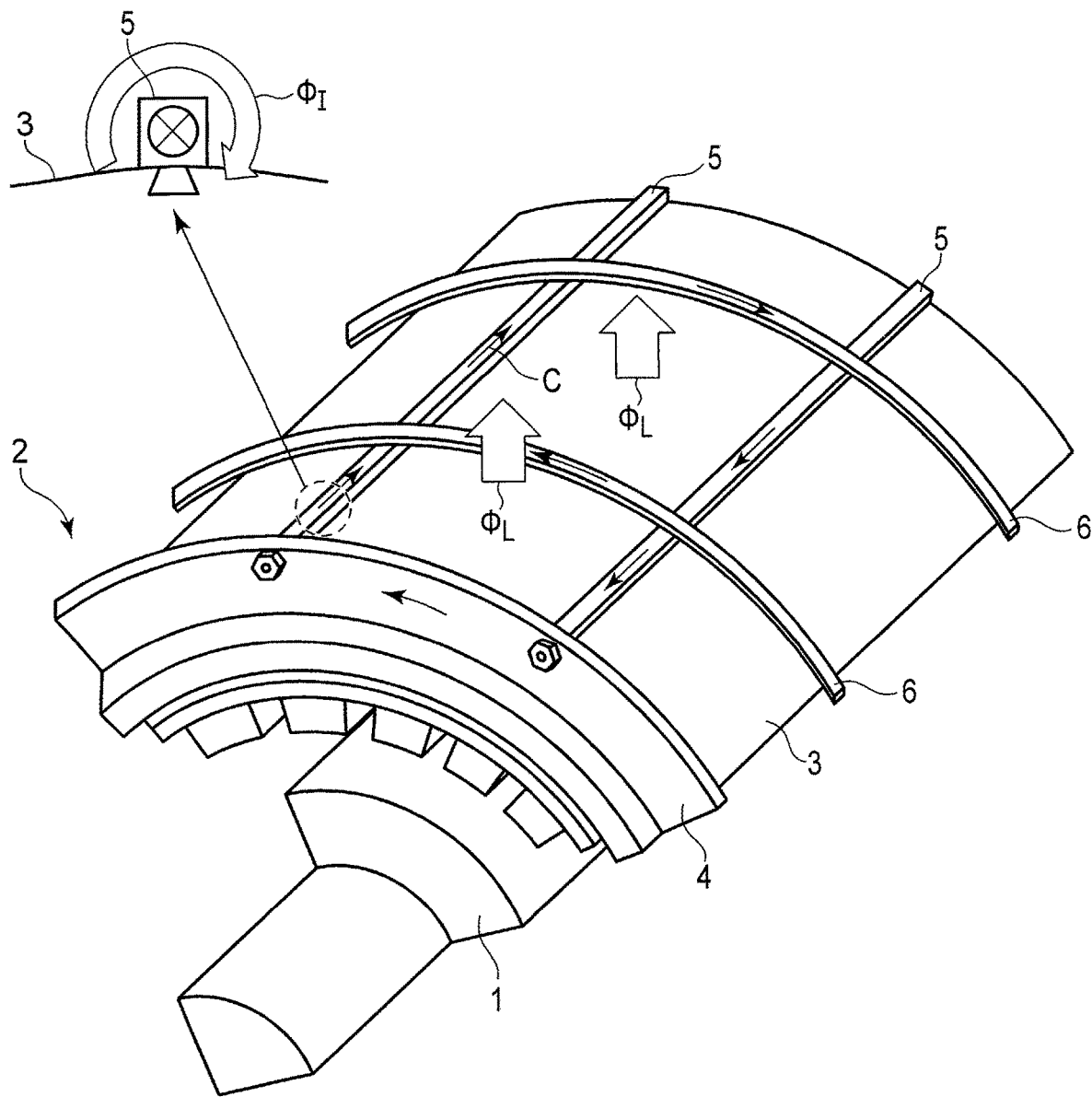
FIG. 2 is a diagram for explaining generation of a back leakage magnetic flux $\Phi_L$ and a magnetic flux $\Phi_I$.

In the rotary electrical machine in operation, a main magnetic flux generated from a field of the rotor 1 passes through the stator core 3. However, as shown in FIG. 2, part of the main magnetic flux leaks from the back (peripheral portion) of the stator core 3, causing a back leakage magnetic flux $\Phi_L$, which interlinks an electric circuit constituted by a support structure (the ribs 5, the core presser rings 6, etc.) of the stator core 3. Since the support structure of the stator core 3 requires mechanical strength, support structure made of metal is used. Therefore, a current C, such as an eddy current, flows through the support structure of the stator core 3 due to the back leakage magnetic flux $\Phi_L$. When the current C (rib current) flows through the rib 5, the magnetic flux $\Phi_I$ due to the rib current is also generated.

Figure 3:
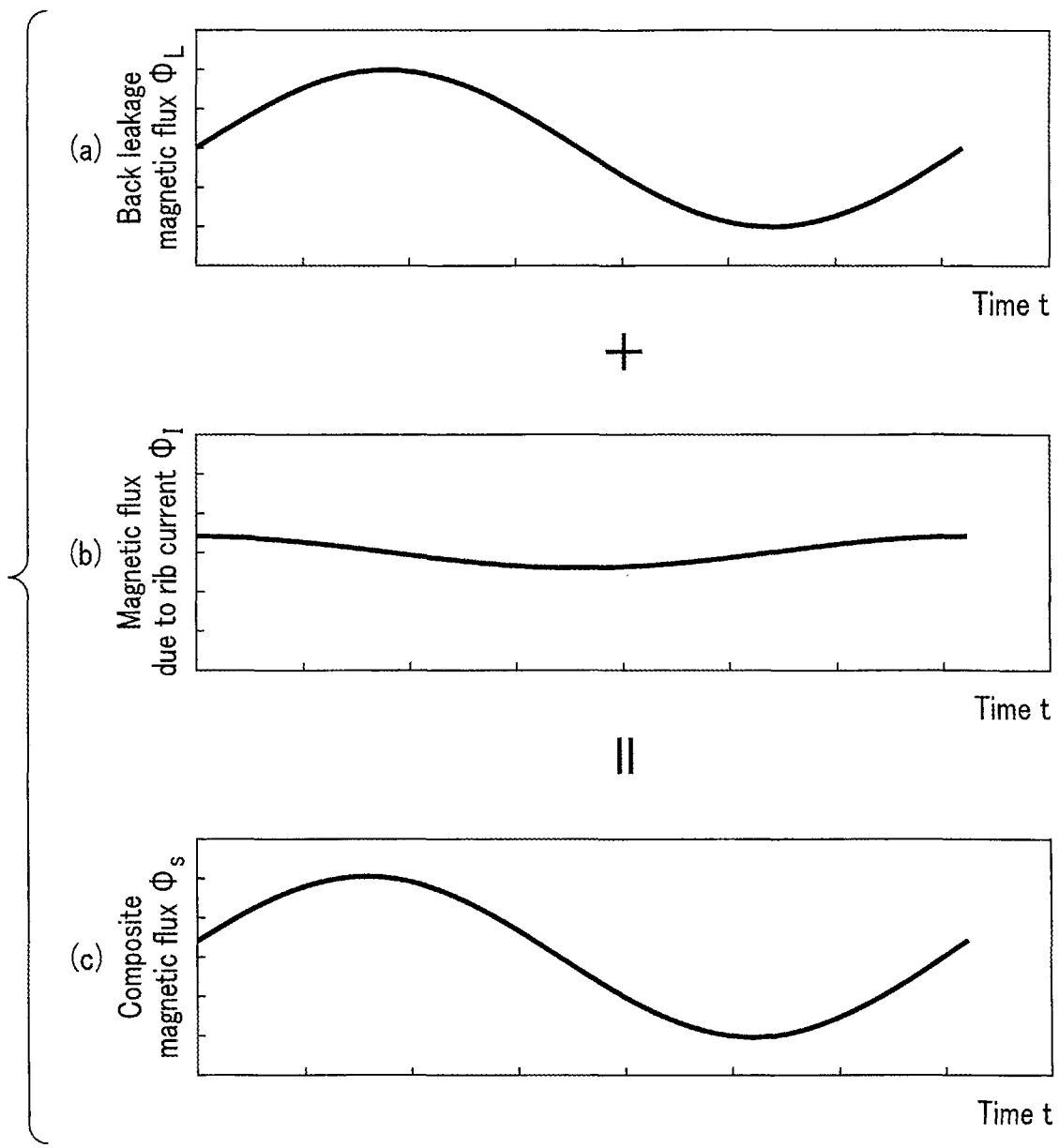
FIG. 3 is a diagram showing an example of respective signal waveforms of a back leakage magnetic flux $\Phi_L$, a magnetic flux $\Phi_I$ due to a rib current, and a composite magnetic flux $\Phi_S$ thereof.

In the example of FIG. 3, (a) to (c) respectively show signal waveforms of the back leakage magnetic flux $\Phi_L$, the magnetic flux $\Phi_I$ due to the rib current, and the composite magnetic flux $\Phi_S$ thereof.

Each of the magnetic flux sensors S mentioned above detects a composite magnetic flux $\Phi_S$ of the back leakage magnetic flux $\Phi_L$ and the magnetic flux $\Phi_I$ due to the rib current.

In the example of FIG. 4, (a) to (c) respectively show signal waveforms of the back leakage magnetic flux $\Phi_L$, the magnetic flux $\Phi_I$ due to the rib current, and the composite magnetic flux $\Phi_S$ thereof, when an arc (primary arc) is generated.

Figure 14:
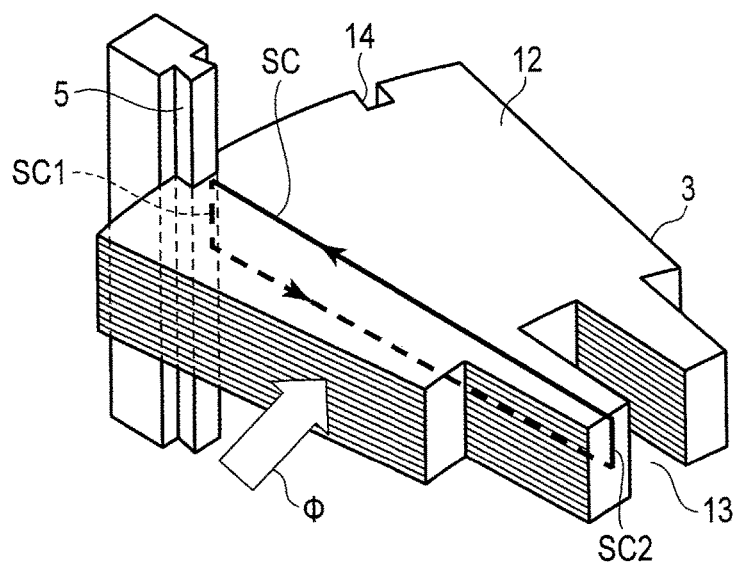
FIG. 14 is a diagram for explaining a short circuit across punched plates.

For example, if a radial outer side of each punched plate 12 shown in FIG. 14 described above is short-circuited by the rib 5, an arc (primary arc) is generated, and a change A in the current also occurs due to the arc in the rib current, and the magnetic flux sensor S detects a composite magnetic flux $\Phi_S$ of the back leakage magnetic flux $\Phi_L$ and the magnetic flux $\Phi_I$ with the change A due to an arc in the rib current.

<Example of Arrangement of Magnetic Flux Sensors (1)>

Figure 6:
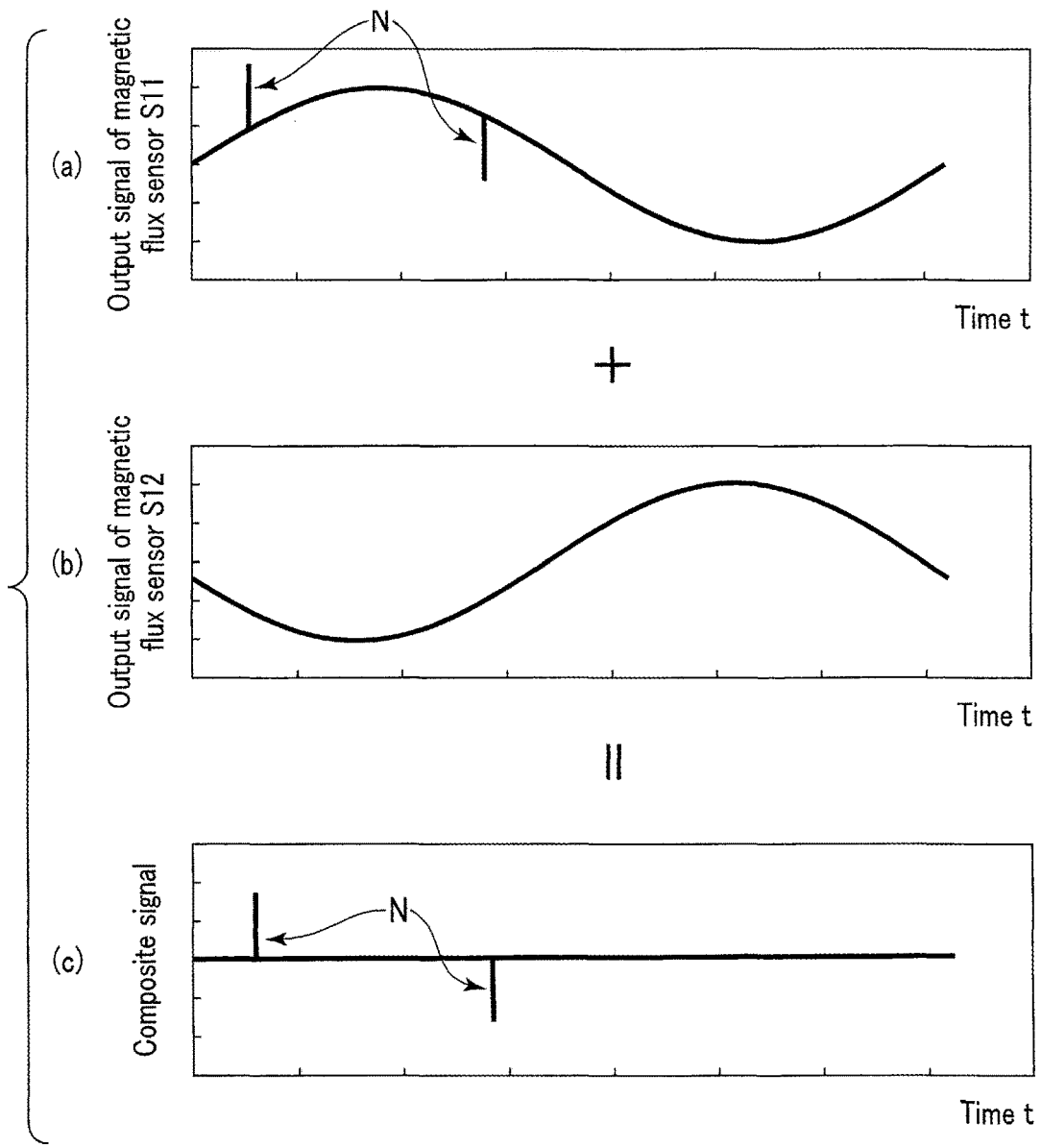
FIG. 6 is a diagram showing an example of respective signal waveforms of an output signal of the magnetic flux sensor S11, an output signal of the magnetic flux sensor S12, and a composite signal thereof in the arrangement shown in FIG. 5.

FIG. 5 shows an example of an arrangement in which the magnetic flux sensors S11 and S12 are disposed on both sides of the rib 5 so as to sandwich the rib 5. In the example of FIG. 6, (a) to (c) respectively show signal waveforms of an output signal of the magnetic flux sensor S11, an output signal of the magnetic flux sensor S12, and a composite signal thereof.

As shown in FIG. 5, the output signals of the magnetic flux sensors S11 and S12 disposed to sandwich one rib 5 are different in polarity with respect to the direction of rib current flow on the left and right sides of the rib 5 in FIG. 5. Therefore, for example, if a noise N different from a noise by a malfunction occurs in one of the output signals as shown in (a) of FIG. 6, when the output signals of (a) and (b) in FIG. 6 are combined, components of the noise N as shown in (c) in FIG. 6 are detected.

The signal processing unit 21 of the abnormality detection apparatus 20 detects the noise from the composite signal, removes the noise if necessary, determines whether a predetermined event (for example, the aforementioned change A due to the arc) appears in the composite signal, and outputs the determination result.

If the event mentioned above appears in either the magnetic flux sensor S11 or S12, the event also appears in the composite signal, and the value of the composite signal exceeds the predetermined set value. The signal processing unit 21, which detects the event, either displays information indicating that an abnormality of the stator core 3 occurs near the corresponding magnetic flux sensor or raises an alert. Alternatively, the signal processing unit 21 may count the number of times when the value of the composite signal exceeds the set value and may display information indicative either of the total number of counts or of the number of counts within a fixed period.

<Example of Arrangement of Magnetic Flux Sensors (2)>

Figure 7:
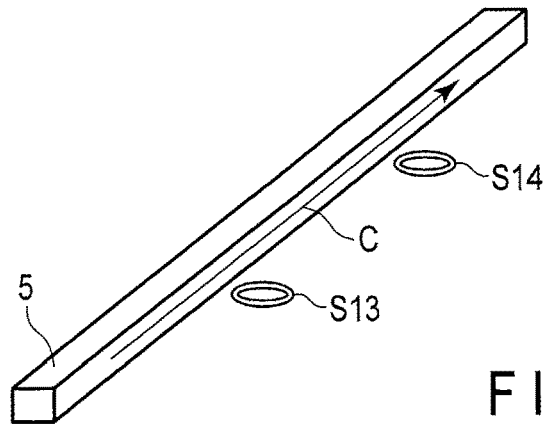
FIG. 7 is a diagram showing an example of an arrangement in which magnetic flux sensors S13 and S14 are disposed in a longitudinal direction of the rib 5.

FIG. 7 shows an example of an arrangement in which the magnetic flux sensors S13 and S14 are disposed in a longitudinal direction of the rib 5. In the example of FIG. 8, (a) to (c) respectively show signal waveforms of an output signal of the magnetic flux sensor S13, an output signal of the magnetic flux sensor S14, and a differential signal corresponding to these output signals.

As shown in FIG. 7, the output signals of the magnetic flux sensors S13 and S14 disposed along the longitudinal direction of the rib 5 are the same in polarity since the magnetic flux due to the same rib current C acts. Therefore, for example, if a noise N different from a noise by a malfunction occurs in one of the output signals as shown in (a) of FIG. 8, when a difference between the output signals of (a) and (b) in FIG. 8 is obtained, components of the noise N as shown in (c) in FIG. 8 are detected.

The signal processing unit 21 of the abnormality detection apparatus 20 detects the noise from the differential signal, removes the noise if necessary, determines whether a predetermined event (for example, the aforementioned change A due to the arc) appears in the differential signal, and outputs the determination result.

If the event mentioned above appears in either the magnetic flux sensor S13 or S14, the event also appears in the differential signal, and the value of the differential signal exceeds the predetermined set value. The signal processing unit 21, which detects the event, either displays information indicating that an abnormality of the stator core 3 occurs near the corresponding magnetic flux sensor or raises an alert. Alternatively, the signal processing unit 21 may count the number of times when the value of the differential signal exceeds the set value and display information either indicative of the total number of counts or of the number of counts within a fixed period.

<Example of Arrangement of Magnetic Flux Sensors (3)>

Figure 9:
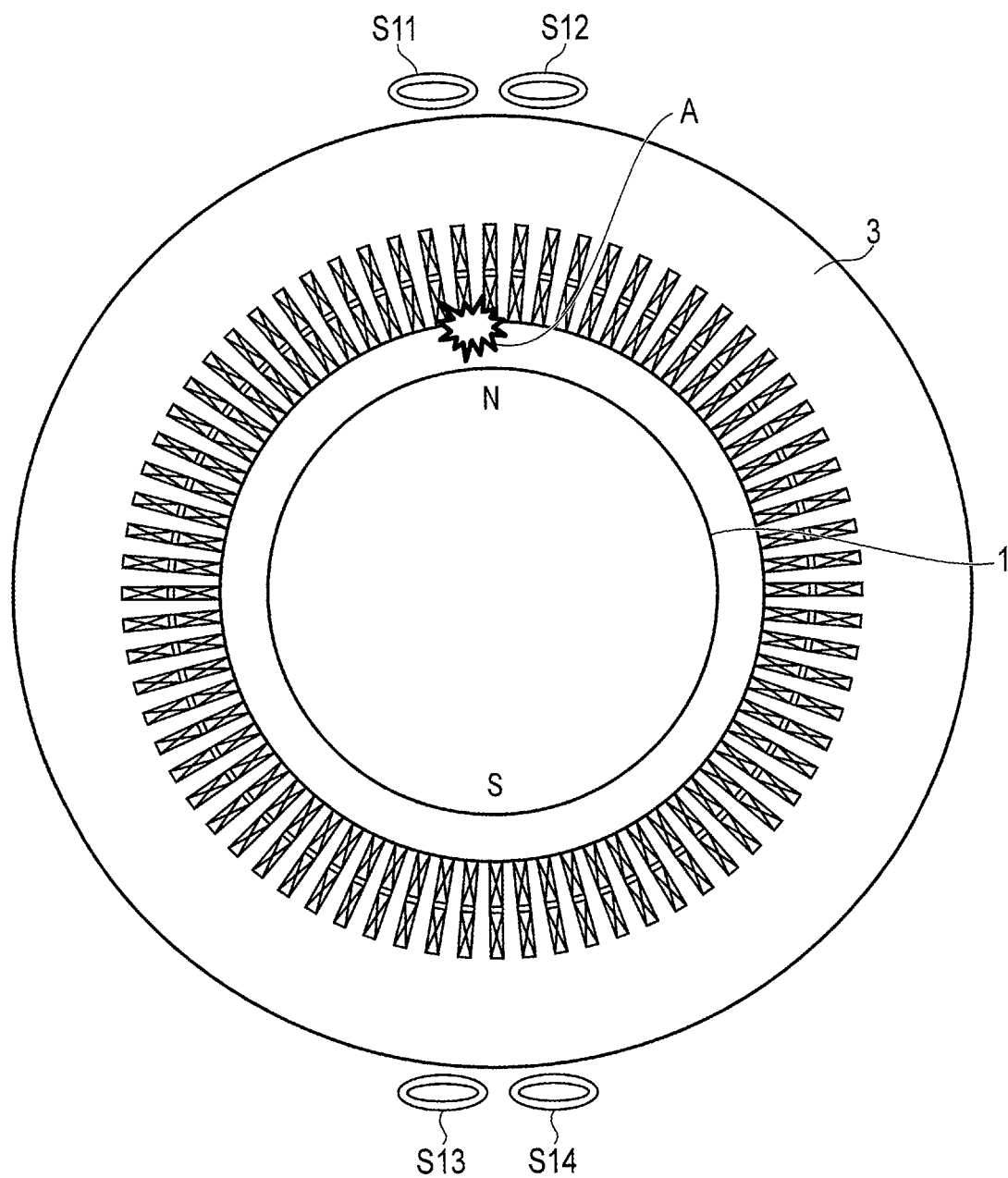
FIG. 9 is a diagram showing an example of an arrangement in which the magnetic flux sensors S11 and S12 and the magnetic flux sensors S13 and S14 are disposed in positions of the rotary electrical machine that are magnetically symmetrical to each other (at an electric angle of 180 degrees)

FIG. 9 shows an example of an arrangement in which the magnetic flux sensors S11 and S12 and the magnetic flux sensors S13 and S14 are disposed in positions of the rotary electrical machine that are magnetically symmetrical to each other (at an electric angle of 180 degrees). In the example of FIG. 10, (a) to (c) respectively show signal waveforms of an output signal of the magnetic flux sensors S11 and S12, an output signal of the magnetic flux sensors S13 and S14, and a composite signal thereof.

The output signal of the magnetic flux sensors S11 and S12 and the output signal of the magnetic flux sensors S13 and S14 disposed as shown in FIG. 9 are different in polarity due to the positions of the magnetic poles. If a predetermined event (for example, the aforementioned change A due to the arc) appears in the output signal as shown in (a) of FIG. 10, when the output signals shown in (a) and (b) of FIG. 10 are combined, the event also appears in the composite signal as shown in (c) of FIG. 10 and the value of the composite signal exceeds the predetermined set value. The signal processing unit 21, which detects the event, either displays information indicating that an abnormality of the stator core 3 occurs near the corresponding magnetic flux sensor or raises an alert. Alternatively, the signal processing unit 21 may count the number of times when the value of the composite signal exceeds the set value and may display information indicative either of the total number of counts or of the number of counts within a fixed period.

<Example of Arrangement of Magnetic Flux Sensors (4)>

Figure 11:
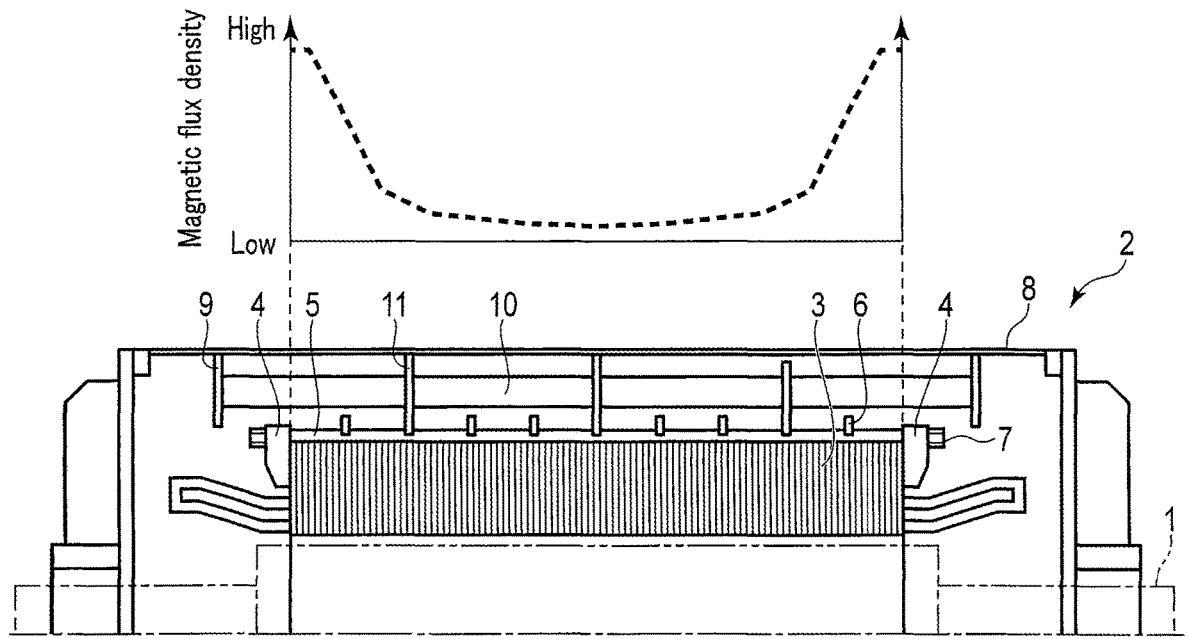
FIG. 11 is a diagram showing magnetic flux densities of the back leakage magnetic flux in a case in which magnetic flux sensors S are disposed in end portions in an axial direction of the stator core 3.

FIG. 11 shows magnetic flux densities of the back leakage magnetic flux in a case in which magnetic flux sensors S are disposed in the end portions in the axial direction of the stator core 3. In the FIG. 11, the sensors S are omitted.

As shown in FIG. 11, the back leakage magnetic flux $\Phi_L$ is greater and the magnetic flux density is higher in the end portions than in a central portion of the axial direction of the stator core 3. Therefore, a greater current flows through the rib 5 and a malfunction of the core is more liable to occur. Therefore, the magnetic flux sensors S disposed in the end portions of the core have higher detection sensitivities and can detect an abnormality earlier.

According to the embodiment, it is possible to provide a reliable abnormality detection system that can detect an abnormality of the stator core 3 with high accuracy, and can also detect a position where the abnormality occurs.

As described in detail above, according to the embodiment, a stator core abnormality in the rotary electrical machine in operation can be easily detected with a simple structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. An abnormality detection system of a rotary electrical machine, the system comprising:
   a plurality of magnetic flux sensors disposed at intervals on a back of a stator core in a circumferential direction or an axial direction, and configured to detect a magnetic flux; and
   an abnormality detection apparatus configured to detect an abnormality of the stator core from a predetermined event that appears in a composite signal or a differential signal obtained from signals respectively output from at least two magnetic flux sensors of the plurality of magnetic flux sensors,
   wherein the at least two magnetic flux sensors are provided for each of ribs that hold stacked cores on the back of the stator core.

2. The abnormality detection system according to claim 1, wherein the at least two magnetic flux sensors are disposed on both sides of one rib to sandwich the one rib in the circumferential direction of the stator core.

3. The abnormality detection system according to claim 1, wherein the at least two magnetic flux sensors are provided for one rib and disposed in a longitudinal direction of the one rib.

4. An abnormality detection system of a rotary electrical machine, the system comprising:
   a plurality of magnetic flux sensors disposed at intervals on a back of a stator core in a circumferential direction or an axial direction, and configured to detect a magnetic flux; and
   an abnormality detection apparatus configured to detect an abnormality of the stator core from a predetermined event that appears in a composite signal or a differential signal obtained from signals respectively output from at least two magnetic flux sensors of the plurality of magnetic flux sensors, wherein the at least two magnetic flux sensors are disposed in positions of the rotary electrical machine that are magnetically symmetrical to each other.

5. The abnormality detection system according to claim 1, wherein each of the at least two magnetic flux sensors is disposed within a fixed distance from a side surface of each of the ribs.

6. The abnormality detection system according to claim 1, wherein each of the at least two magnetic flux sensors is disposed in end portions in an axial direction of the stator core.

7. An abnormality detection system of a rotary electrical machine, the system comprising:
- a plurality of magnetic flux sensors disposed at intervals on a back of a stator core in a circumferential direction or an axial direction, and configured to detect a magnetic flux; and
- an abnormality detection apparatus configured to detect an abnormality of the stator core from a predetermined event that appears in a composite signal or a differential signal obtained from signals respectively output from at least two magnetic flux sensors of the plurality of magnetic flux sensors,
- wherein the abnormality detection apparatus is configured to correct a phase shift that occurs depending on a positional relationship between a location of each magnetic flux sensor and a location of a magnetic pole of the rotary electrical machine with respect to the signal output from each of the at least two magnetic flux sensors, and to output a composite signal or a differential signal of the corrected signal.

8. The abnormality detection system according to claim 1, wherein the abnormality detection apparatus is configured to raise an alert when either a value of the composite signal or a value of the differential signal exceeds a set value.

9. An abnormality detection system of a rotary electrical machine, the system comprising:
- a plurality of magnetic flux sensors disposed at intervals on a back of a stator core in a circumferential direction or an axial direction, and configured to detect a magnetic flux; and
- an abnormality detection apparatus configured to detect an abnormality of the stator core from a predetermined event that appears in a composite signal or a differential signal obtained from signals respectively output from at least two magnetic flux sensors of the plurality of magnetic flux sensors,
- wherein the abnormality detection apparatus is configured to count a number of times when either a value of the composite signal or a value of the differential signal exceeds a set value, and display information either indicative of a total number of counts or of a number of counts within a fixed period.

10. The abnormality detection system according to claim 1, wherein cables leading from the at least two magnetic flux sensors are coupled to obtain either a composite signal or a differential signal among the signals respectively output from the at least two magnetic flux sensors, and configured to input either the composite signal or the differential signal to the abnormality detection apparatus through one cable.

* * * * *